United States Patent
Cabler

[11] Patent Number: 5,414,424
[45] Date of Patent: May 9, 1995

[54] FOURTH-ORDER CASCADED SIGMA-DELTA MODULATOR

[75] Inventor: Carlin D. Cabler, Austin, Tex.

[73] Assignee: Advanced Micro Devices, Inc., Sunnyvale, Calif.

[21] Appl. No.: 112,610

[22] Filed: Aug. 26, 1993

[51] Int. Cl.⁶ .................................................. H03M 3/02
[52] U.S. Cl. .................................... 341/143; 375/247
[58] Field of Search ................ 341/143; 375/25–34

[56] References Cited

U.S. PATENT DOCUMENTS

| | | | |
|---|---|---|---|
| 4,704,600 | 11/1987 | Uchimura et al. | 341/143 |
| 4,876,542 | 10/1989 | van Bavel et al. | 341/143 |
| 5,061,928 | 10/1991 | Karema | 341/143 |
| 5,084,702 | 1/1992 | Ribner | 341/143 |
| 5,103,229 | 4/1992 | Ribner | 341/143 |
| 5,148,167 | 9/1992 | Ribner | 341/143 |
| 5,153,593 | 10/1992 | Walden et al. | 341/143 |
| 5,283,578 | 2/1994 | Ribner et al. | 341/143 |

Primary Examiner—Marc S. Hoff
Attorney, Agent, or Firm—Fulbright & Jaworski

[57] ABSTRACT

A system and method for cascading three sigma-delta modulators involves applying an error signal representing the quantization error of a preceding modulator to a subsequent modulator. The error signal is scaled by a factor before being applied to a subsequent modulator. The quantized error signal of the subsequent modulator is then scaled by the reciprocal of the original scaling factor before being combined with the quantized outputs of the previous modulators. Combining the quantized outputs of the three modulators is performed so as to cancel the quantization error of the previous stages while shaping the noise at the last stage so that most of the noise is placed at high frequencies.

2 Claims, 11 Drawing Sheets

FOURTH-ORDER CASCADED SIGMA-DELTA MODULATOR

BACKGROUND OF THE INVENTION

1. Field of the Invention

The present invention relates generally to sigma-delta modulators. More particularly, the present invention relates to methods of cascading sigma-delta modulators.

2. Description of Related Art

Oversampled interpolative (or sigma-delta) modulators comprise at least one integration stage or filter followed by a quantization stage (most typically a comparator) and a feedback from the output of the quantization stage to the input of the integration stage. Depending upon the number of integration stages, sigma-delta modulators can be divided into order types, e.g., second-order, third-order, or fourth-order.

Sigma-delta modulators have come to be commonly used to perform analog-to-digital (A/D) and digital-to-analog (D/A) conversion in a number of applications. These applications include coder-decoders (codecs), integrated services digital network (ISDN) equipment, and audio equipment.

The use of higher order sigma-delta modulators has become desirable in many applications for several reasons. One reason is because the introduction of higher order modulators increases the number of integrations to be carried out, which results in a decrease in the noise level of the passband as the quantization noise is shifted to a higher frequency level. Another reason is because the use of higher order modulators keeps the oversampling ratio (i.e., the ratio of the modulator clock to the Nyquist rate) low, which is desirable under certain conditions.

A number of efforts have heretofore been undertaken to develop higher order sigma-delta modulators. Four such efforts, those undertaken by Matsuya et al., Ribner, Chao et al. and Karema et al., are discussed immediately below.

Matsuya, et al., in "A 16-Bit Oversampling A-D Conversion Technology Using Triple-Integration Noise Shaping", IEEE Journal of Solid State Circuits, Vol. SC-22, No. 6, pp. 921–929, December 1987, have presented a method of cascading three or more first-order modulators in order to provide higher order noise shaping. A block diagram of this circuit is shown in FIG. 1. The technique employed in this circuit, well known to those skilled in the art as the "MASH" technique, is described at length in U.S. Pat. No. 5,061,928 to Karema. That discussion is hereby incorporated herein by this reference thereto. Although the circuit in FIG. 1 could be discussed at length, given the level of skill of those skilled in the art, it suffices here to say that the circuit of FIG. 1 depicts three cascaded first-order modulators (each generally designated by reference numeral 2). Each first-order modulator 2 comprises an integrator 4 and a quantizer 6. It may be seen in FIG. 1 that the difference between the output signals of the integrators 4 and the quantizers 6 of the two topmost modulators 2 are fed to subsequent modulators 2. By doing this, quantized noise is moved up out of band, where it can be subsequently, and easily, filtered out. The MASH technique has a number of shortcomings however. First, the MASH technique requires tight matching of the characteristics of the modulators to achieve good resolution. The MASH technique also requires high op amp gains to accomplish the same results. Further, the technique has been shown to be quite sensitive to analog component mismatch when used as an A/D converter. Mismatches in the analog circuitry result in uncancelled quantization noise leaking into the passband. Theoretically, however, with regard to the circuit of FIG. 1, if the input to the converter is given as x, and the quantization error of the last modulator is given as $E_3$, the output, y, can be expressed as follows:

$$y = xz^{-3} + E_3(1-z^{-1})^3$$

As previously mentioned, Ribner also has worked to develop higher order sigma-delta modulators. Ribner, in "A Third-Order Multistage Sigma-Delta Modulator with Reduced Sensitivity to Nonidealities", IEEE J. Solid-State Circuits, Vol. 26, No. 12, pp. 1764–1774, December 1991, and in U.S. Pat. Nos. 5,148,167, 5,148,166, and 5,065,157, has presented a method of cascading a second-order modulator with a first-order modulator. A block diagram of this circuit is shown in FIG. 2 wherein the second-order modulator is generally designated with reference numeral 8 and the first-order modulator generally designated with reference numeral 10. Referring to the bottommost portion of FIG. 2, it is depicted that Ribner teaches combining the quantized outputs $y_1$, $y_2$ of the modulators 8, 10 in such a manner that the quantization noise of the second-order section is cancelled while the quantization noise of the first-order section is shaped in a third-order manner. Once again, mathematically, if the input to the converter is given as x, and the quantization error of the first-order modulator is given as $E_2$, the output, y, can be expressed as follows:

$$y = z^{-3}x + C(1-z^{-1})^3 E_2$$

In this case a gain of $1/C$ was added between the modulators 8, 10 in order to prevent the second modulator 10 from overflowing. In order to compensate for the factor of $1/C$, a gain of C is added in the correction logic. This can be seen in FIG. 2 in the form of element 12 (the gain adding portion) and element 14 (the compensation portion).

Chao et al., in "A Higher Order Topology for Interpolative Modulators For Oversampling A/D Converters, IEEE Transactions on Circuits and Systems, Vol. 37, No. 3, pp. 309–318, March 1990, have proposed a single loop structure for higher order sigma-delta modulators. These modulators consist of a multitude of integrators, feed-forward paths, feed-back paths, and a single quantizer in order to synthesize the desired noise shaping. These modulators suffer from the possibility that they may enter into a mode of self sustained oscillations for certain input values. Various methods have been proposed to desensitize these converters to this phenomena, all of which complicate the structure. It has been noted, however, that single stage first- and second-order modulators of this type do not suffer from this phenomena.

For audio applications, it is desired that the signal-to-total distortion, including noise, be equivalent to that of a standard 16-bit linear converter. Simulations have indicated that for an oversampling ratio of 64, and using practical circuit techniques, third-order modulators built based upon any of the above methods will exceed the performance of a standard 16-bit linear converter. However, the amount of margin beyond 16 bits is not very high. Therefore, it is desired that a sigma-delta converter be built with fourth-order noise shaping.

Karema et al., in U.S. Pat. No. 5,061,924, have introduced a fourth-order topology which comprises of a cascade of two second-order modulators. This is shown in FIG. 3 wherein the two second-order modulators are generally designated with reference numeral 16. As shown therein, a gain of 1/C (in the form of gain element 18) has been added between the two modulators in order to prevent overflow of the second modulator. As in Ribner's modulator depicted in FIG. 2, a digital circuit is added to Karema et al.'s cascade. This circuit, generally designated by reference numeral 20, is set forth at the bottom of FIG. 3. This circuit combines the quantized outputs of the two second-order sections $y_1$, $y_2$ in such a manner that the quantization error of the first modulator is cancelled and the quantization error of the second modulator receives fourth-order shaping. Algebraically, if the input to the converter is given as x, and the quantization error of the second modulator is given as $E_2$, then the output y can be expressed as:

$$y = z^{-4}x + C(1-z^{-1})^4 E_2$$

Based upon the foregoing, it should be understood and appreciated that fourth-order sigma-delta modulators have important advantages over lesser order modulators in certain applications. Further on this point, the signal-to-noise ratio (SNR) of ideal sigma-delta modulators is given by the following equation:

$$SNR = (2L+1) \, 10 \log (OSR) - 10 \log (\pi^{2L}/2L+1)$$

where OSR is the oversampling ratio and L is the order of the modulator. For example, if L=3 and the OSR=64, the SNR equals 105 dB. If L=4 and OSR=64, the SNR equals 132.3 dB. Thus, a fourth-order loop has more inherent margin for 16-bit performance than does a third-order loop with the same oversampling ratio. Although fourth-order sigma-delta modulators, such as that taught by Karema et al., have heretofore been proposed, it is a shortcoming and deficiency of the prior art that there are not additional types of such modulators to use.

It is also important to understand that single loop modulators offer certain cost advantages over second-order modulators. On the other hand, use of first-order modulators involves more complex matching requirements than does use of second-order modulators. It is another shortcoming and deficiency of the prior art that there has not yet been developed a fourth-order sigma-delta modulator that strikes a balance between pure use of single order loops and pure use of second-order modulators.

SUMMARY OF THE INVENTION

The present invention overcomes the shortcomings and deficiencies mentioned above by providing a method of cascading three sigma-delta modulators by applying an error signal representing the quantization error of a preceding modulator to a subsequent modulator. In order to improve the performance of the cascade of modulators, the error signal is scaled by a factor, typically less than one, before being applied to the subsequent modulator. The quantized error signal of the subsequent modulator is then scaled by a reciprocal of the original scaling factor before being combined with the quantized outputs of the previous modulators. The technique of combining the quantized outputs of the three modulators is performed in such a way so as to cancel the quantization error of the previous stages while shaping the noise of the last stage so that most of the noise is placed at high frequencies.

According, an object of the present invention is to provide a system and method for accomplishing high resolution A/D conversion.

Another object of the present invention is to provide a new type of fourth-order sigma-delta modulator.

Yet another object of the present invention is to provide a high order sigma-delta modulator that strikes a balance between pure use of single order loops and pure use of second-order modulators.

BRIEF DESCRIPTION OF THE DRAWINGS

Other objects, advantages, and novel features of the present invention may best be understood by reference to the following detailed description taken in conjunction with the accompanying drawings in which.

DETAILED DESCRIPTION OF THE INVENTION

Figure 1:
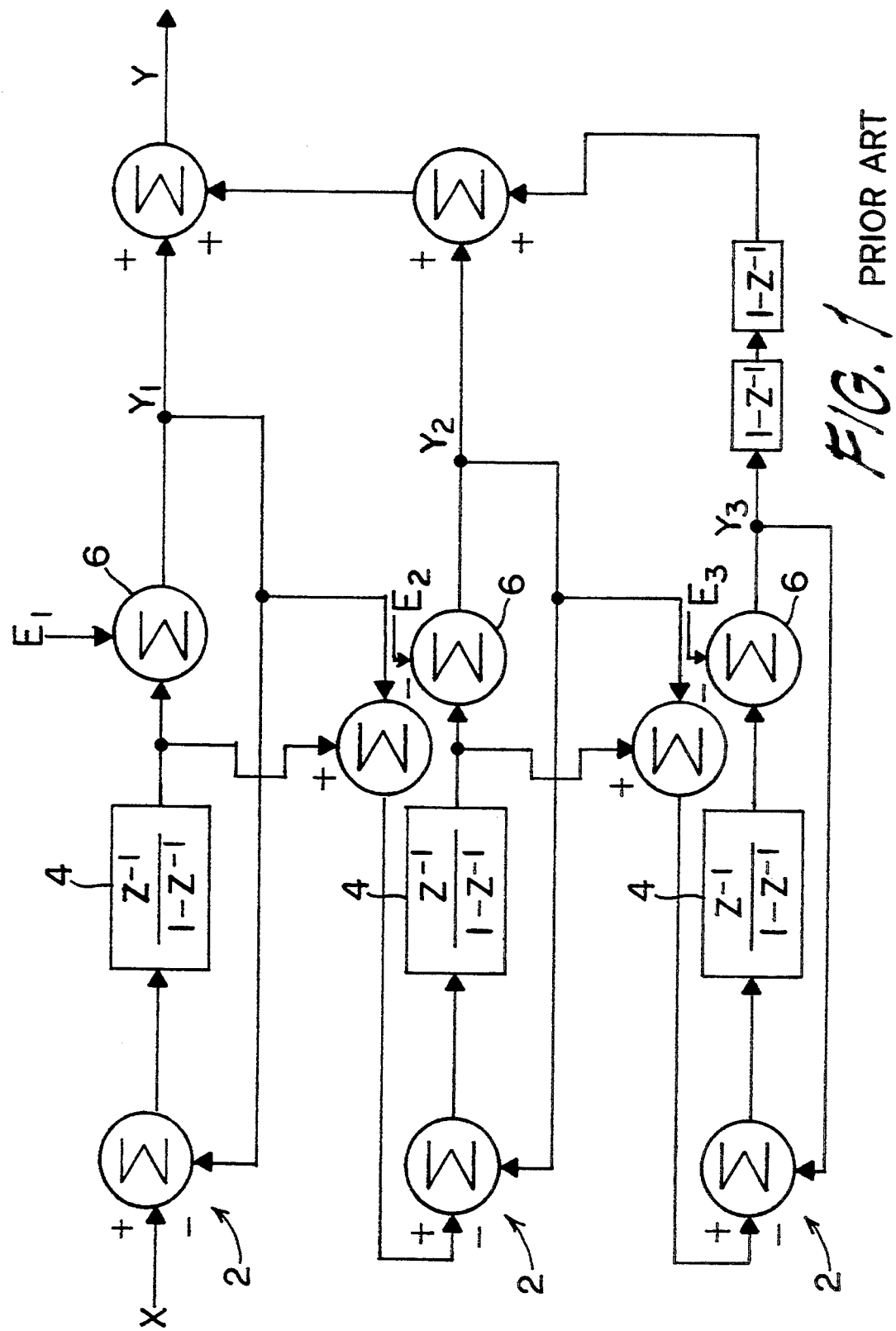
FIG. 1, previously described, depicts a prior art method of cascading three or more first-order modulators.
Figure 2:
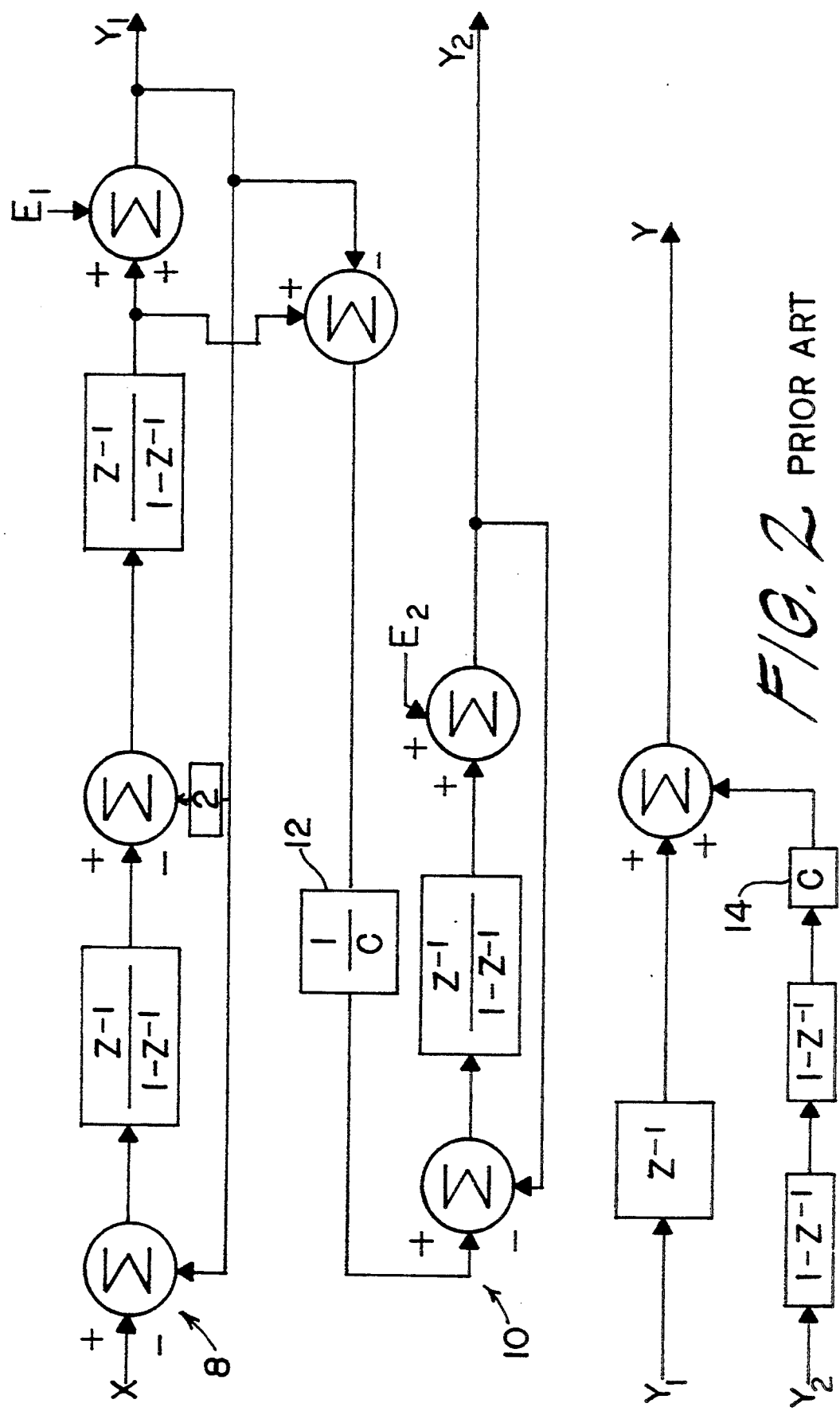
FIG. 2, previously described, depicts a prior art method of combining a second-order modulator with a first-order modulator.
Figure 3:
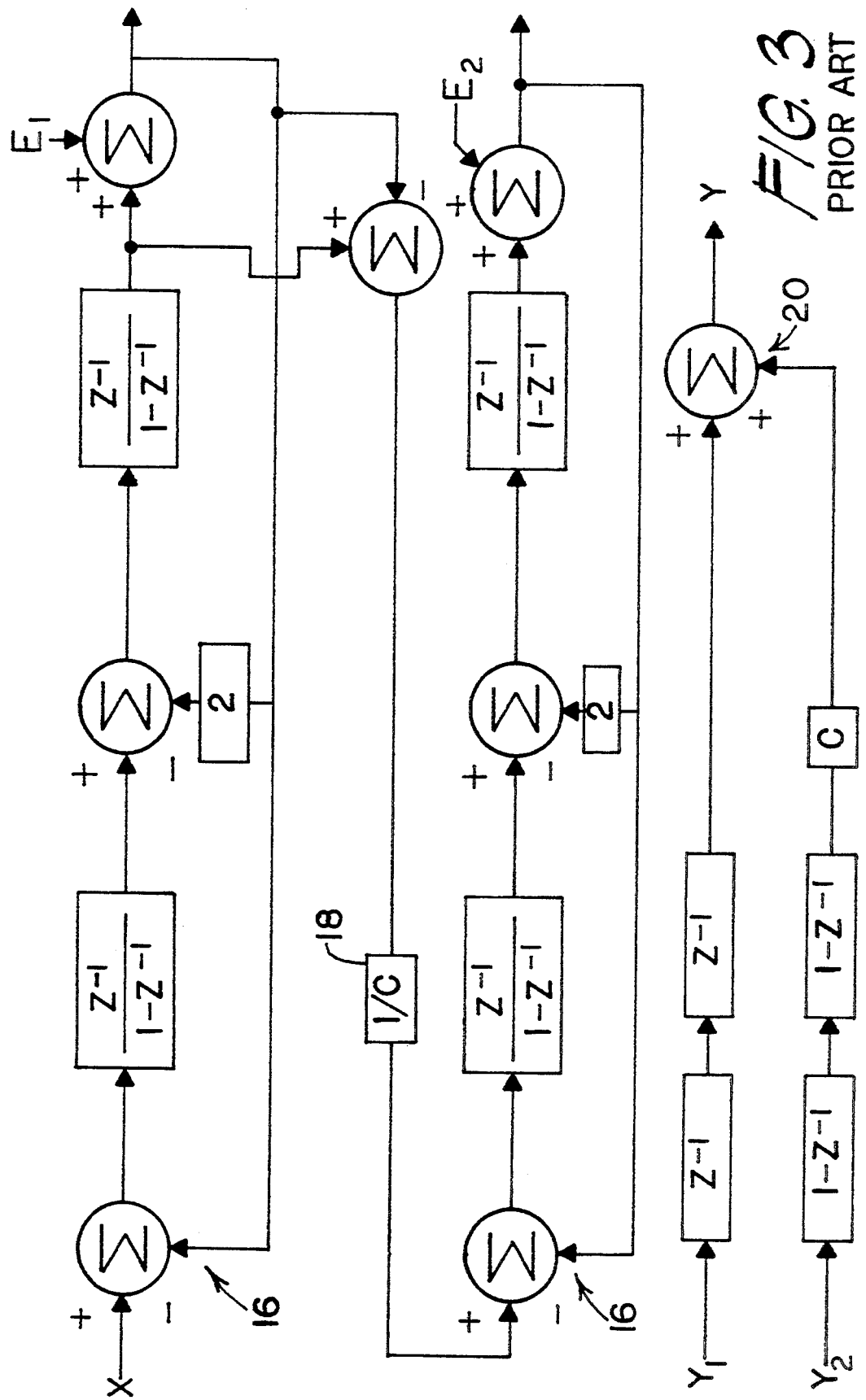
FIG. 3, previously described, depicts a prior art fourth-order topology which comprises a cascade of two second-order modulators.
Figure 4:
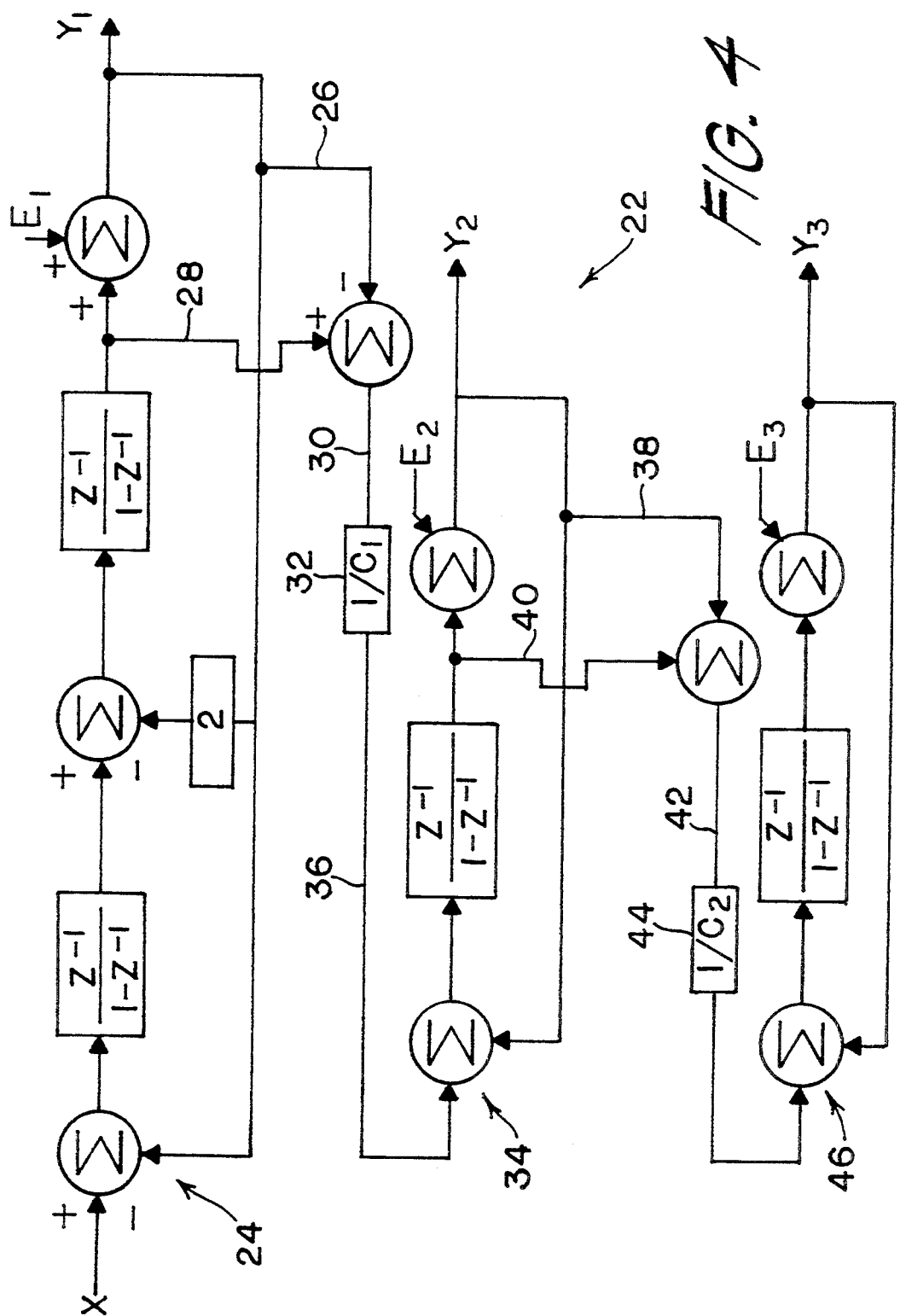
FIG. 4 is a schematic diagram of an embodiment of the present invention.

Referring now to FIG. 4, there is shown a schematic diagram of an embodiment of the present invention generally designated by reference numeral 22. The embodiment 22 comprises a conventional second-order modulator (generally designated by reference numeral 24) having an output, $y_1$. The output of the second-order section 24, $y_1$, is given by the following equation:

$$y_1 = z^{-2}x + (1-z^{-1})^2 E_1$$

In embodiment 22, the output is simply the sum of the input, which has been delayed by two sample periods, and the quantization error which has been filtered with the high pass filter function $(1-z^{-1})^2$. As in all conventional sigma-delta modulators, such operation pushes the noise added by the quantizer to high frequencies where it may be easily filtered by standard techniques.

The quantized and reconstructed output (on line 26) is then subtracted from the input to the quantizer (on line 28). The resulting quantity is simply the quantization error, $-E_1$, which appears on line 30. $-E_1$ is then scaled by a factor $1/C_1$ (by element 32) before being applied to the input of a first-order modulator (generally designated by reference numeral 34) in order to prevent the first-order modulator 34 from overloading.

First-order modulator 34 has a transfer function given by the following equation:

$$y = z^{-1}x + (1-z^{-1})E$$

Here, the output is simply the sum of the input, which has been delayed by one sample period, and the quantization error which has been filtered with the high pass filter function $(1-z^{-1})$. Again, the result is that the noise which has been added by the quantizer is pushed to higher frequencies where it can be filtered easily by standard techniques.

As previously mentioned, the scaled error signal, $-E_1/C_1$, on line 36 in FIG. 4, is applied to the first-order modulator 34. Using the equation above, the output of modulator 34, $y_2$, is given by the following equation:

$$y_2 = -z^{-1} E_1/C_1 + (1-z^{-1})E_2$$

In this case, $E_2$ is the quantization error added by the first-order modulator 34. Once again, the quantized and reconstructed output of this modulator (on line 38) is then subtracted from the input to its quantizer (on line 40). The resulting quantity is the quantization error, $-E_2$, which appears on line 42. $-E_2$ is then scaled by a factor $1/C_2$ (by element 44) before being applied to the input of another first-order modulator (generally designated by reference numeral 46) in order to prevent the first-order modulator 46 from overloading. Using the basic equation for a first-order modulator given above, the output $y_3$ of the third modulator 46 is described by the following equation:

$$y_3 = -z^{-1} E_2/C_2 + (1-z^{-1})E_3$$

$y_1$, $y_2$, and $y_3$ must now be combined so that the quantization error $E_1$ and the quantization error $E_2$ are cancelled, with the resulting quantization error of the last first-order stage, i.e., stage 46, having fourth-order noise shaping. Toward this goal, it should be recognized that if the output $y_2$ is delayed by a single sample period (i.e. multiplied by $z^{-1}$), the resulting output $y_2'$ would be:

$$y_2' = -z^{-2} E_1/C_1 + z^{-1}(1-z^{-1})E_2$$

Likewise, if the output $y_3$ were differentiated (i.e. passed through the function $(1-z^{-1})$ and then scaled by a factor of $C_1$, the resulting output $y_3'$ would be:

$$y_3' = C_2(1-z^{-1})^2 E_3 - z^{-1}(1-z^{-1})E_2$$

Then, if $y_2 \propto$ and $y_3'$ are summed:

$$y_2' + y_3' = -z^{-2} E_1/C_1 + C_2(1-z^{-1})^2 E_3$$

In this quantity, the quantization noise, $E_2$, has been cancelled.

If $y_2' + y_3'$ are then passed through a series of two differentiators (i.e. passed through the function $(1-z^{-1})^2$ and then scaled by a factor $C_1$, the resulting output $y_4$ would be:

$$y_4 = -z^{-2}(1-z^{-1})^2 E_1 + (C_1)(C_2)(1-z^{-4}) E_3$$

Then, if $y_1$ is delayed by two sample periods (i.e. multiplied by $z^{-1}$ twice), the resulting quantity $y_1'$ would be:

$$y_1' = z^{-2}(1-z^{-1})^2 e_1 + z^{-4}x$$

If the quantities $y_1'$ and $y_4$ are summed together, the resulting output, $y_{out}$, would be:

$$y_{out} = z^{-4}x + (C_1)(C_2)(1-z^{-4})^4 E_3$$

Figure 5:
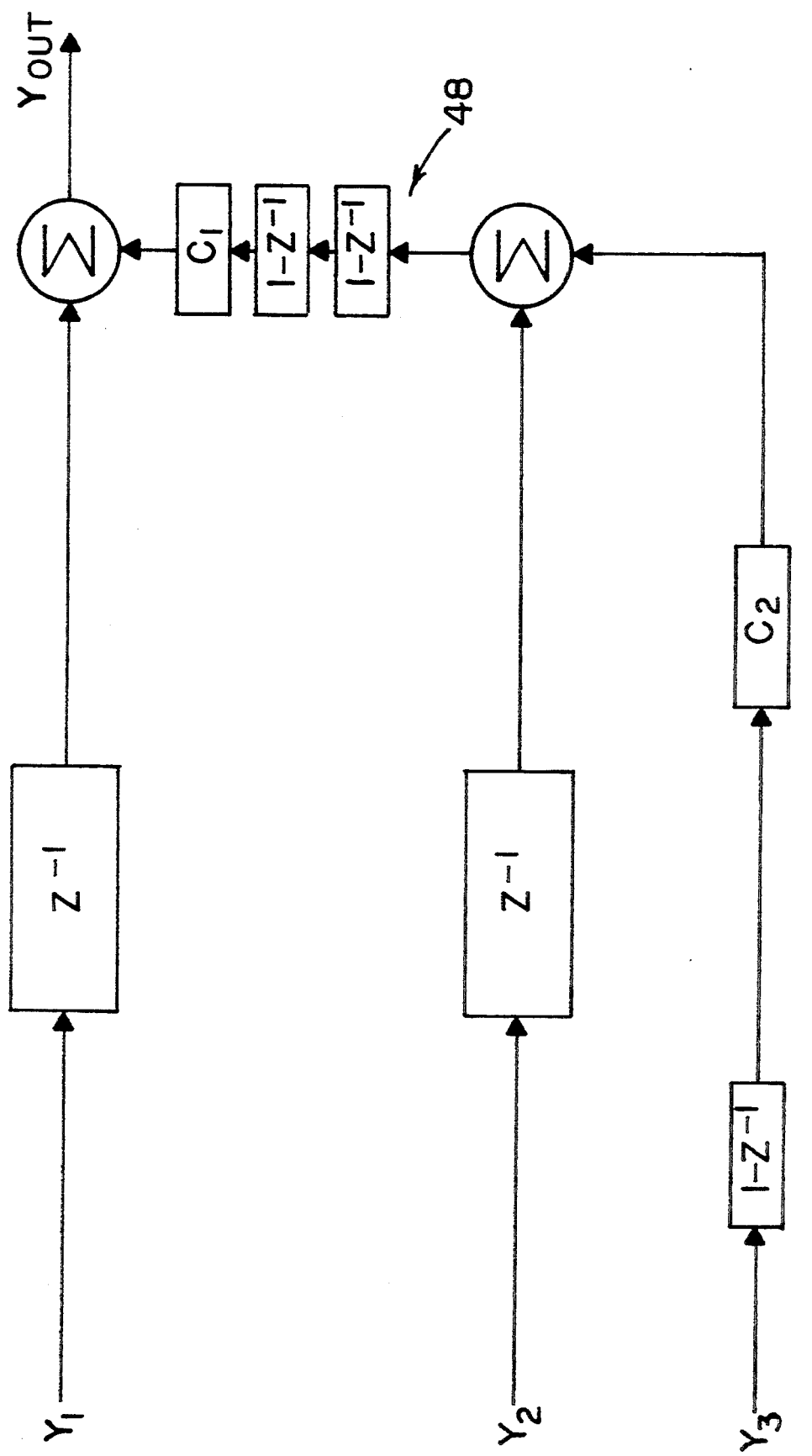
FIG. 5 is a block diagram of a circuit which combines three outputs into a single output using a provided equation.

The quantization error of the second-order modulator 24, $E_1$, and the quantization error of the first first-order modulator 34, $E_2$, have been cancelled. The quantization error of the last first-order modulator 46, $E_3$ has now been high pass filtered by the function $(1-z^{-1})^4$ and scaled by a factor $(C_1)(C_2)$. This is the desired basic form for a sigma-delta modulator with fourth-order noise shaping. A block diagram of a circuit which combines the three outputs into a single output using the equations developed above is shown in FIG. 5 and is generally designated therein with reference numeral 48.

Figure 6:
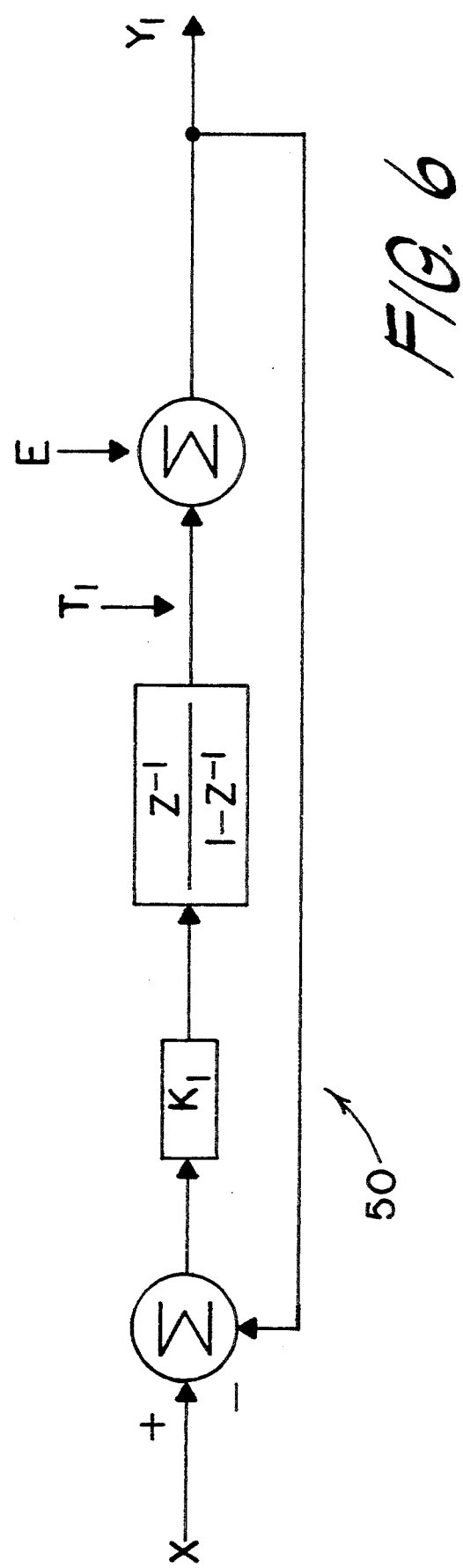
FIG. 6 is a block diagram of a scaled first-order sigma-delta modulator with a one-bit quantizer.

In practical systems, especially A/D converters, the quantizer that is often used is simply an analog comparator followed by a 1-bit DAC whose output can be either a positive voltage or a negative voltage depending upon the digital output of the comparator. In these systems, scaling is often performed inside individual first- or second-order sigma-delta modulators. A block diagram of a scaled first-order sigma-delta modulator with a 1-bit quantizer is shown in FIG. 6 and is generally designated therein with reference numeral 50. Since the quantizer is only 1-bit, the output, y, of this modulator 50 is determined by the sign of the input to the quantizer, $T_1$. The scaling factor, $K_1$, is added to prevent the output of the integrator from becoming so large that clipping occurs within the integrator. Thus, for input signal ranges of reasonable size, the output y is unaffected by the scaling factor $K_1$. The output of this modulator 50, y, is given by the following equation, where E is the quantization noise;

$$y = z^{-1}x + (1-z^{-1})E$$

Figure 7:
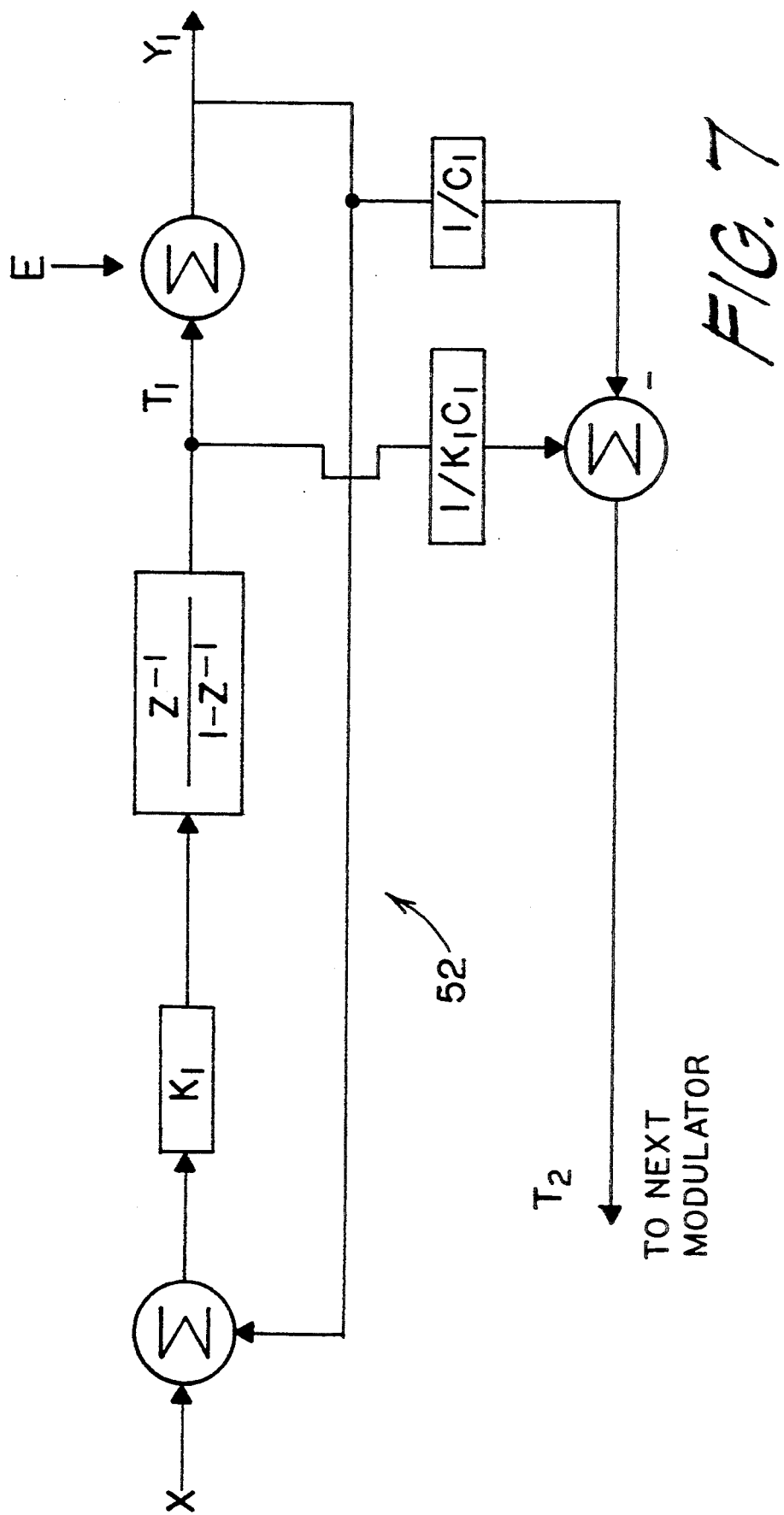
FIG. 7 depicts additional scaling applied in order to realize an interstage gain $1/C_1$.

The input to the quantizer is, however, effected by the scaling factor, $K_1$. If a scaled first-order sigma-delta modulator is used as a section of a cascaded sigma-delta modulator, such as the one shown in FIG. 4, then additional scaling must be applied in order to realize the interstage gain, $1/C_1$. Such a modulator (generally designated by reference numeral 52) is shown in FIG. 7. The output y is scaled by $1/C_1$. The input to the quantizer, $T_1$, is scaled by a factor of $1/(K_1C_1)$. For example, if $K_1$ equals $\frac{1}{2}$, and it is desired that $1/C_1$ be $\frac{1}{4}$, then the output, y, must be scaled by $\frac{1}{4}$ and the input to the quantizer, $T_1$, must be scaled by $\frac{1}{2}$. The difference between the scaled value of $T_1$ and the scaled value of the output, y, is then applied to the subsequent modulator in the cascade.

Figure 8:
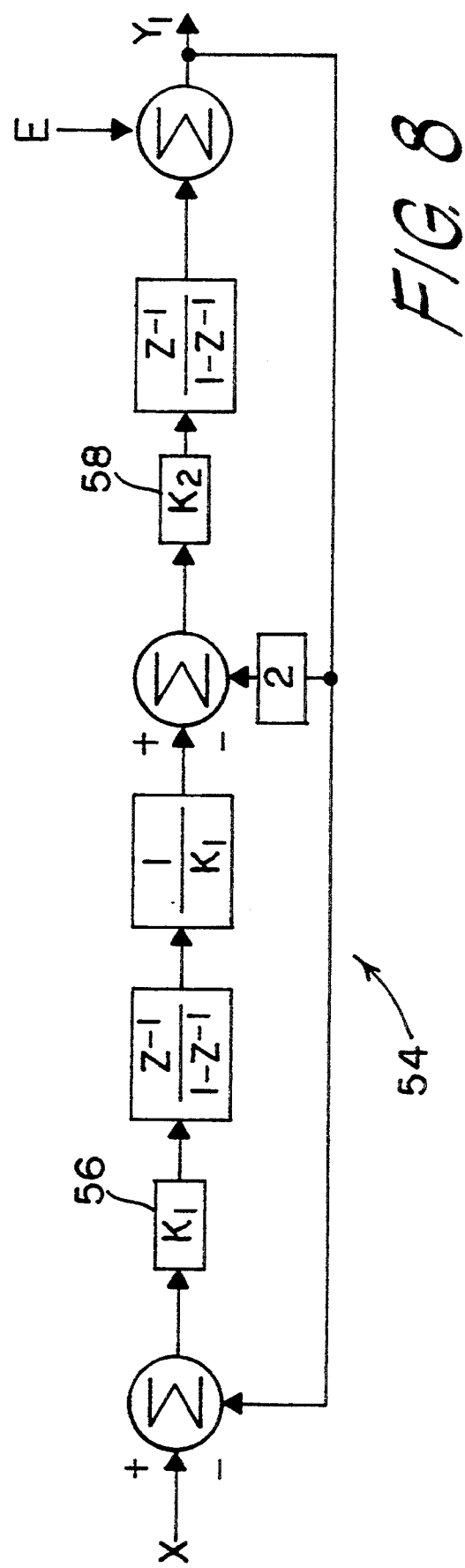
FIG. 8 is a schematic diagram of a second-order modulator having internal scaling.

Likewise, practical second-order modulators may also have internal scaling. Such a modulator (generally designated by reference numeral 54) is shown in FIG. 8. In this case, three scaling factors have been added. The first scaling factor 56, $K_1$, is added to prevent the first integrator from clipping for large signals. In order to maintain the correct overall transfer function for the modulator, a factor of $1/K_1$ is placed at the input to the subtraction point before the second integrator. A second scaling factor 58, $K_2$, is added before the input to the second integrator. As is the case for a first-order sigma-delta modulator with a 1-bit quantizer, only the sign of the input to the quantizer is quantized. Thus the scaling factor, $K_2$, has no effect on the overall transfer function as seen at the output y. Its only effect is to prevent clipping in the second integrator for large signals. The equation which describes the output of the modulator with respect to the input and quantization error, E, is:

$$y = z^{-2}x + (1-z^{-1})^2 E$$

Figure 9:
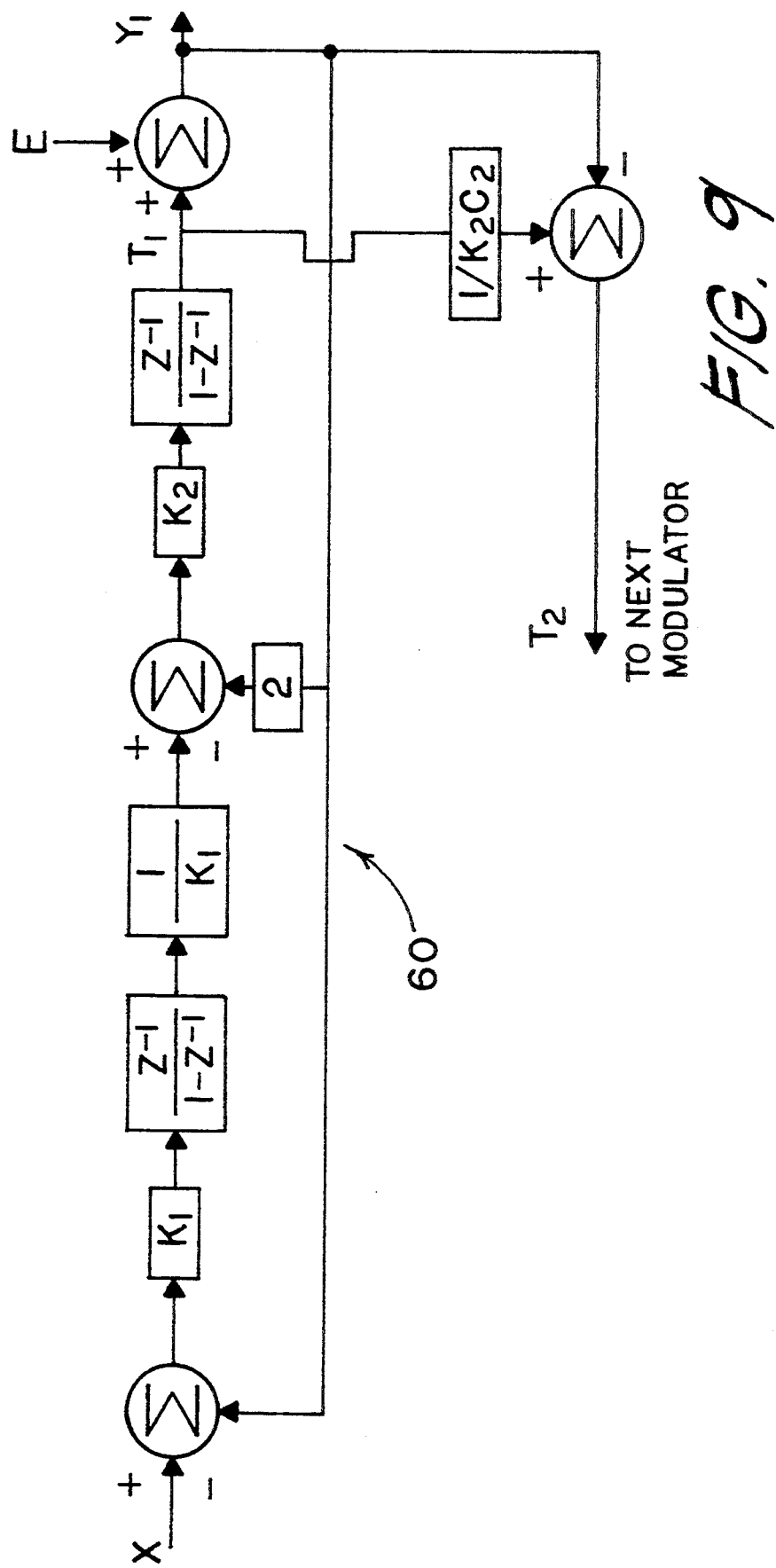
FIG. 9 depicts additional scaling employed.

As in the case of a scaled first-order modulator, the scaling factor $K_2$ does have an effect on the magnitude of the input to the quantizer. If a scaled second-order sigma-delta modulator is used as a section of a cascaded sigma-delta modulator, additional scaling must be added in order to realize the interstage scaling $1/C_1$. Such a modulator (generally designated by reference numeral 60) is shown in FIG. 9. The output, y, is scaled by $1/C_1$. The input to the quantizer is scaled by a factor of $1/(K_2C_2)$. The difference between the scaled values of $T_1$ and $y_1$ is then applied to the next sigma-delta modulator in the cascade.

Figure 10:
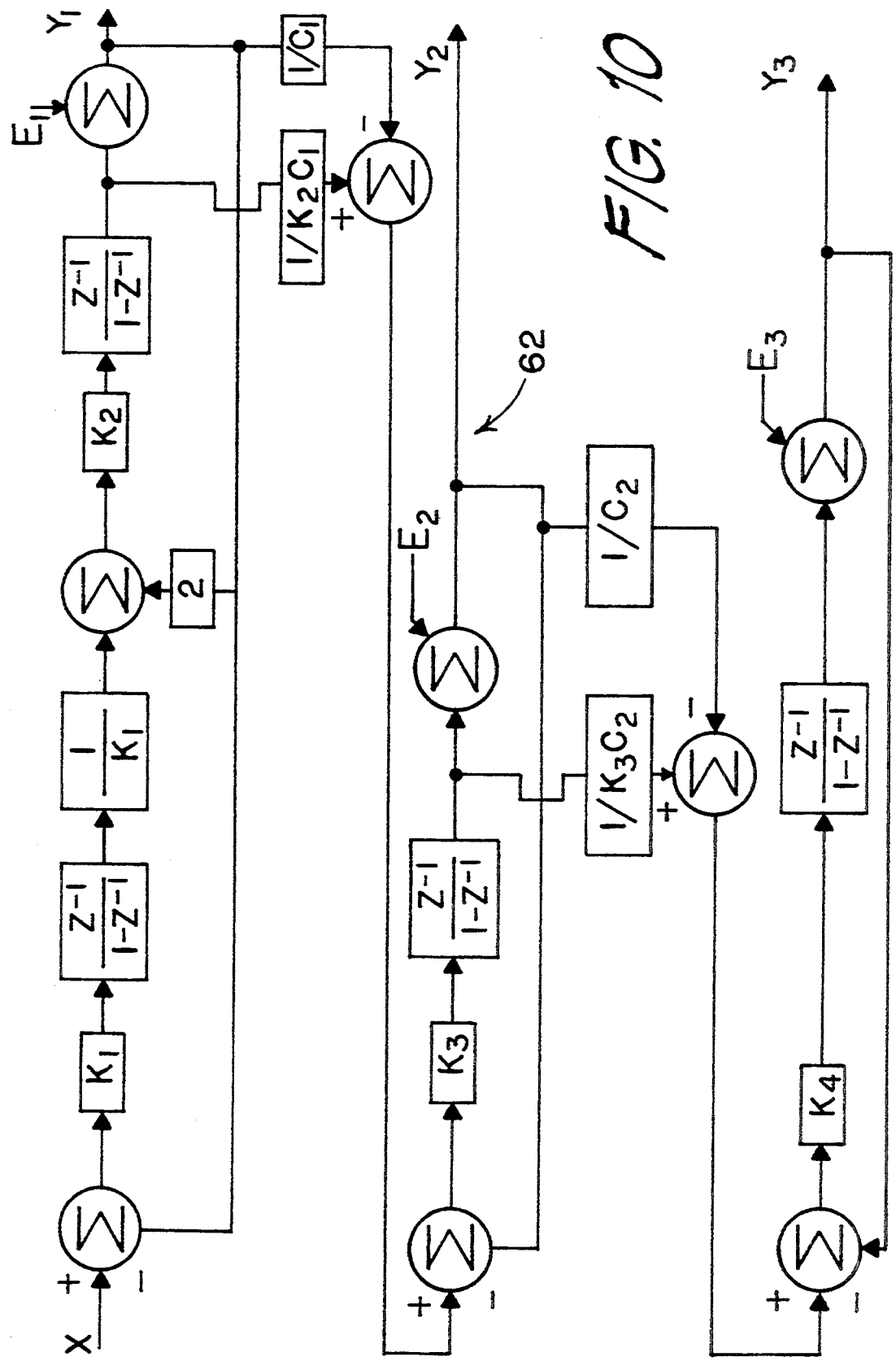
FIG. 10 is a schematic diagram of an embodiment of the present invention using scaled sigma-delta modulators.

Referring now to FIG. 10, there is a shown a diagram of an embodiment of the present invention (generally designated by reference numeral 62) using scaled sigma-delta modulators. The cancellation circuit which combines the outputs $y_1$, $y_2$, and $y_3$ is unchanged from FIG. 5 and, thus, is not shown here. For practical systems, the integrators are typically realized with switched capacitor summing integrators. Thus, all scaling factors, the integrators, and the differencing nodes in the diagrams can be realized using standard analog techniques.

Figure 11:
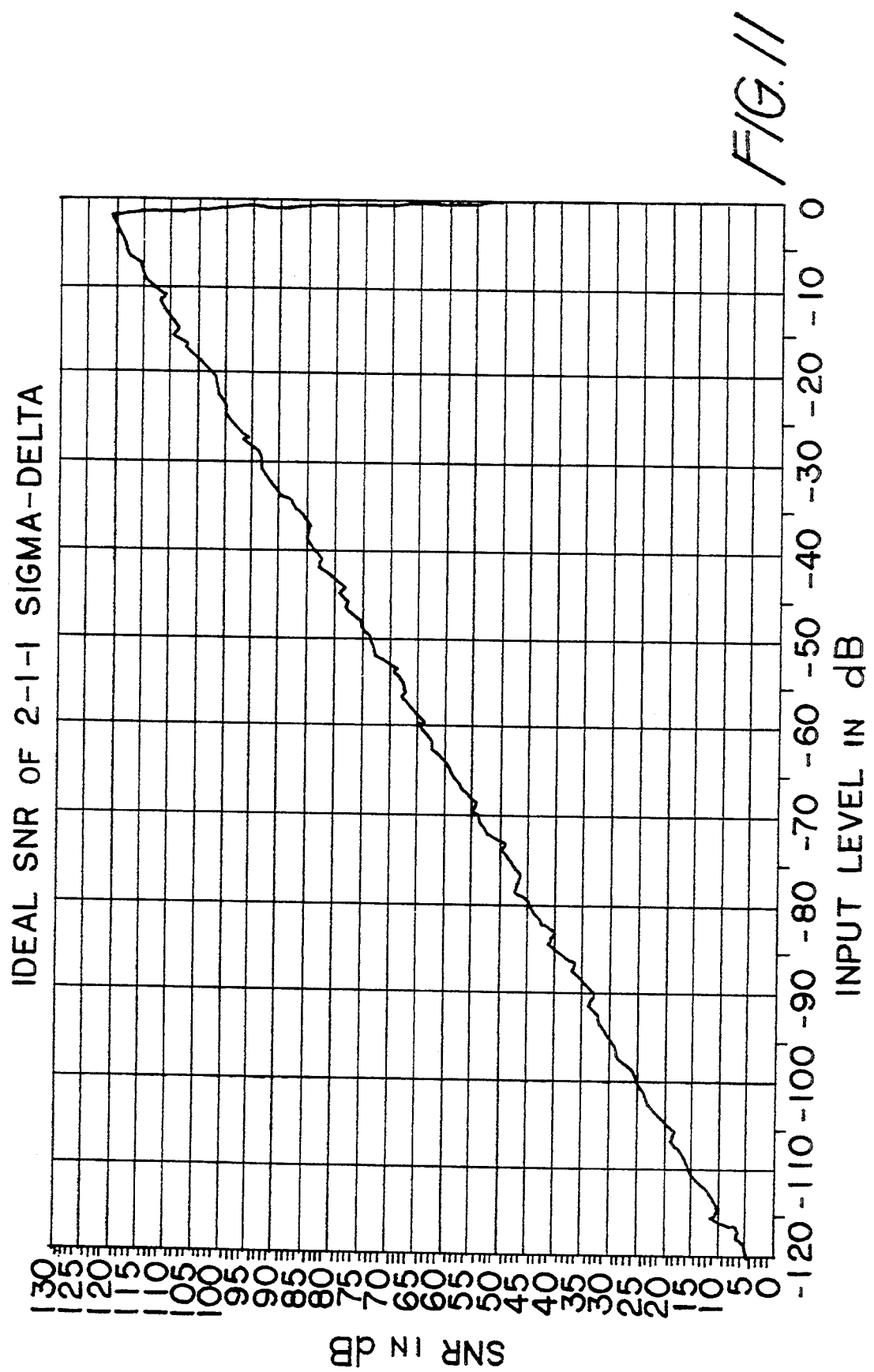
FIG. 11 is a plot of simulated SNR for an embodiment of the present invention.

Based upon the foregoing, those skilled in the art should understand and appreciate how the present invention provides a fourth-order cascaded sigma-delta modulator that strikes a balance between pure use of first-order modulators and pure use of second-order modulators. Thus, the present invention provides a cost effective alternative to prior art modulators for use in many applications. Performance of embodiments of the present invention should be outstanding as evidenced, in part, by the plot set forth in FIG. 11. FIG. 11 depicts simulated SNR for a case where $C_1$ equals 4 and $C_2$ equals 2. This level of performance well satisfies the requirements of even top quality ISDN and audio equipment.

Obviously, numerous modifications and variations are possible in view of the above teachings. Accordingly, within the scope of the appended claims, the present invention may be practiced otherwise than as specifically described hereinabove.

What is claimed is:

1. A method of cascading three sigma-delta modulators; said three modulators definable as a first, a second, and a third modulator; wherein said first modulator is a second-order modulator; said second modulator is a first-order modulator; and said third modulator is a first-order modulator;

said three modulators also interrelated as preceding from a first through subsequent to a last modulator; said method comprising the steps of:

applying an error signal representing a quantization error of a preceding modulator to a subsequent modulator in said cascade to be quantized therein;

scaling said error signal of the preceding modulator by a first factor, before being applied to said subsequent modulator;

scaling said error signal quantized by said subsequent modulator by a second factor substantially equal to the inverse of the first factor;

delaying an output of said first modulator by two sample periods;

delaying an output of said second modulator by a single sample period;

differentiating said output of said third modulator;

scaling the output of said third modulator by a predetermined factor less than 1;

summing said delayed output of said second modulator and said differentiated and scaled output of said third modulator;

passing said delayed output of said second modulator arid said differentiated and scaled output of said third modulator through a series of two differentiators and scaling them by a predetermined factor; and summing said twice differentiated and scaled outputs of said second and said third modulators and said delayed output of said first modulator;

whereby the quantization errors of both said first and second modulator are canceled.

2. A sigma-delta modulator system comprising: a first modulator, comprising a second-order sigma-delta modulator, for quantizing a main signal;

means for producing an error signal representing a quantization error of said second-order sigma-delta modulator;

first means for scaling said error signal by a first scaling factor smaller than one;

a second modulator, comprising a first-order sigma-delta modulator, for quantizing said error signal scaled by said first scaling means;

means for differentiating said quantized error signal;

second means for scaling said quantized error signal by a second scaling factor substantially equal to the inverse of said first scaling factor;

means for delaying an output of said first modulator;

means for delaying an output of said second modulator;

a third modulator, comprising a first-order sigma-delta modulator, for quantizing said error signal scaled by said second scaling means;

means for differentiating an output of said third modulator;

third means for scaling said output of said third modulator by a predetermined factor less than one;

means for summing said delayed output of said second modulator and said differentiated and scaled output of said third modulator;

a series of two differentiators connected to the delayed output of said second modulator and to said differentiated and scaled output of said third modulator, whereby an output of said series of two differentiators is scaled by a predetermined factor;

a fourth means for scaling an output of said series of two differentiators, said series having an output; and means for summing said output of said fourth scaling means and said delayed output of said first modulator.

* * * * *